(12) United States Patent
    Mangrum

(10) Patent No.: US 11,658,099 B2
(45) Date of Patent: *May 23, 2023

(54) FLIP CHIP CURVED SIDEWALL SELF-ALIGNMENT FEATURES FOR SUBSTRATE AND METHOD FOR MANUFACTURING THE SELF-ALIGNMENT FEATURES

(71) Applicant: Amkor Technology Singapore Holding Pte. Ltd., Valley Point (SG)

(72) Inventor: Marc Alan Mangrum, Manchaca, TX (US)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 17/113,498

(22) Filed: Dec. 7, 2020

(65) Prior Publication Data

US 2021/0265247 A1    Aug. 26, 2021

Related U.S. Application Data

(63) Continuation of application No. 16/042,566, filed on Jul. 23, 2018, now Pat. No. 10,861,776, which is a
(Continued)

(51) Int. Cl.
    H01L 23/495    (2006.01)
    H01L 23/00    (2006.01)
    (Continued)

(52) U.S. Cl.
    CPC .... H01L 23/49541 (2013.01); H01L 21/4825 (2013.01); H01L 23/49548 (2013.01);
    (Continued)

(58) Field of Classification Search
    CPC ......... H01L 24/13; H01L 24/16; H01L 24/81; H01L 2223/54426; H01L 2224/13147;
    (Continued)

(56) References Cited

U.S. PATENT DOCUMENTS 5,348,214 A * 9/1994 Nishiguchi ............. H01L 24/81
                                                29/841
6,018,189 A * 1/2000 Mizuno ................... H01L 24/75
                                                257/668
(Continued)

*Primary Examiner* — Khiem D Nguyen
(74) *Attorney, Agent, or Firm* — McAndrews, Held & Malloy, Ltd.

(57) ABSTRACT

Methods and system for flip chip alignment for substrate and leadframe applications are disclosed and may include placing a semiconductor die on bond fingers of a metal leadframe, wherein at least two of the bond fingers comprise one or more recessed self-alignment features. A reflow process may be performed on the semiconductor die and leadframe, thereby melting solder bumps on the semiconductor die such that a solder bump may be pulled into each of the recessed self-alignment features and aligning the solder bumps on the semiconductor die to the bond fingers. The recessed self-alignment features may be formed utilizing a chemical etch process or a stamping process. A surface of the recessed self-alignment features or the bond fingers of the metal leadframe may be roughened. A solder paste may be formed in the recessed self-alignment features prior to placing the semiconductor die on the bond fingers of the metal leadframe.

18 Claims, 8 Drawing Sheets

Related U.S. Application Data continuation of application No. 14/264,027, filed on Apr. 28, 2014, now Pat. No. 10,032,699.

(51) Int. Cl.
*H01L 23/544* (2006.01)
*H01L 21/48* (2006.01)

(52) U.S. Cl.
CPC ............ *H01L 23/544* (2013.01); *H01L 24/81* (2013.01); *H01L 21/4828* (2013.01); *H01L 24/13* (2013.01); *H01L 24/16* (2013.01); *H01L 2223/54426* (2013.01); *H01L 2223/54486* (2013.01); *H01L 2224/13082* (2013.01); *H01L 2224/13116* (2013.01); *H01L 2224/13147* (2013.01); *H01L 2224/16245* (2013.01); *H01L 2224/81143* (2013.01); *H01L 2224/81192* (2013.01); *H01L 2224/81385* (2013.01); *H01L 2224/81815* (2013.01); *H01L 2924/14* (2013.01)

(58) Field of Classification Search
CPC . H01L 2224/13116; H01L 2924/00014; H01L 2924/0105; H01L 23/49541; H01L 23/49548; H01L 23/544; H01L 21/4825; H01L 21/4828; H01L 2224/81143
USPC ........................................................ 257/673
See application file for complete search history.

(56) References Cited

U.S. PATENT DOCUMENTS

| | | | | |
|---|---|---|---|---|
| 6,172,422 | B1* | 1/2001 | Chigawa | H01L 24/29 |
| | | | | 361/767 |
| 6,864,423 | B2* | 3/2005 | Tan | H01L 21/4842 |
| | | | | 174/536 |
| 7,808,089 | B2* | 10/2010 | Nguyen | H01L 24/97 |
| | | | | 257/676 |
| 8,039,307 | B2* | 10/2011 | Kojima | H01L 24/16 |
| | | | | 438/107 |
| 9,142,431 | B2* | 9/2015 | Pagaila | H01L 24/92 |
| 10,032,699 | B1* | 7/2018 | Mangrum | H01L 23/544 |
| 10,861,776 | B2* | 12/2020 | Mangrum | H01L 23/49548 |
| 2002/0030261 | A1* | 3/2002 | Rolda, Jr. | H01L 25/0652 |
| | | | | 257/685 |
| 2005/0133896 | A1* | 6/2005 | Liu | H01L 23/49575 |
| | | | | 257/E23.092 |
| 2006/0097366 | A1* | 5/2006 | Sirinorakul | H01L 23/495 |
| | | | | 257/666 |
| 2008/0237814 | A1* | 10/2008 | Bayan | H01L 24/97 |
| | | | | 257/666 |
| 2009/0155955 | A1* | 6/2009 | Liang | H01L 21/56 |
| | | | | 438/108 |
| 2012/0126429 | A1* | 5/2012 | Do | H01L 24/14 |
| | | | | 257/777 |
| 2013/0065361 | A1* | 3/2013 | Shen | H01L 23/4952 |
| | | | | 257/E21.599 |
| 2014/0210107 | A1* | 7/2014 | Zhai | H01L 23/498 |
| | | | | 257/777 |

* cited by examiner

FLIP CHIP CURVED SIDEWALL SELF-ALIGNMENT FEATURES FOR SUBSTRATE AND METHOD FOR MANUFACTURING THE SELF-ALIGNMENT FEATURES

CROSS-REFERENCE TO RELATED APPLICATIONS/INCORPORATION BY REFERENCE

The present application is a continuation of U.S. application Ser. No. 16/042,566, filed Jul. 23, 2018, now U.S. Pat. No. 10,861,776, and titled "FLIP CHIP SELF-ALIGNMENT FEATURES FOR SUBSTRATE AND LEADFRAME APPLICATIONS," which is continuation of U.S. application Ser. No. 14/264,027, filed Apr. 28, 2014, now U.S. Pat. No. 10,032,699, and titled "FLIP CHIP SELF-ALIGNMENT FEATURES FOR SUBSTRATE AND LEADFRAME APPLICATIONS." Each of the above-mentioned applications is hereby incorporated herein by reference in its entirety.

FIELD

Certain embodiments of the disclosure relate to semiconductor chip packaging. More specifically, certain embodiments of the disclosure relate to a method and system for flip chip self-alignment features for substrate and leadframe applications.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in flip chip self-alignment features for substrate and leadframe applications. Example aspects of the disclosure may comprise placing a semiconductor die on a plurality of bond fingers of a metal leadframe, wherein at least two of the plurality of bond fingers comprise one or more recessed self-alignment features. A reflow process may be performed on the semiconductor die and leadframe, thereby melting solder bumps (or other attachment structures) on the semiconductor die such that a solder bump is pulled into each of the recessed self-alignment features and aligning the solder bumps on the semiconductor die to the plurality of bond fingers. The recessed self-alignment features may be formed utilizing a chemical etch process or a stamping process. A surface of the recessed self-alignment features or at least one surface of the bond fingers of the metal leadframe may be roughened. A solder paste may be formed in the recessed self-alignment features prior to placing the semiconductor die on the plurality of bond fingers of the metal leadframe. The recessed self-alignment features may be elliptical-shaped. A depth of the recessed self-alignment features may be less than 50 microns. Two recessed self-alignment features may be formed on at least one bond finger of the metal leadframe at locations corresponding with four corners of the semiconductor die. The die and at least one surface of the bond fingers may be covered with encapsulant.

Figure 1:
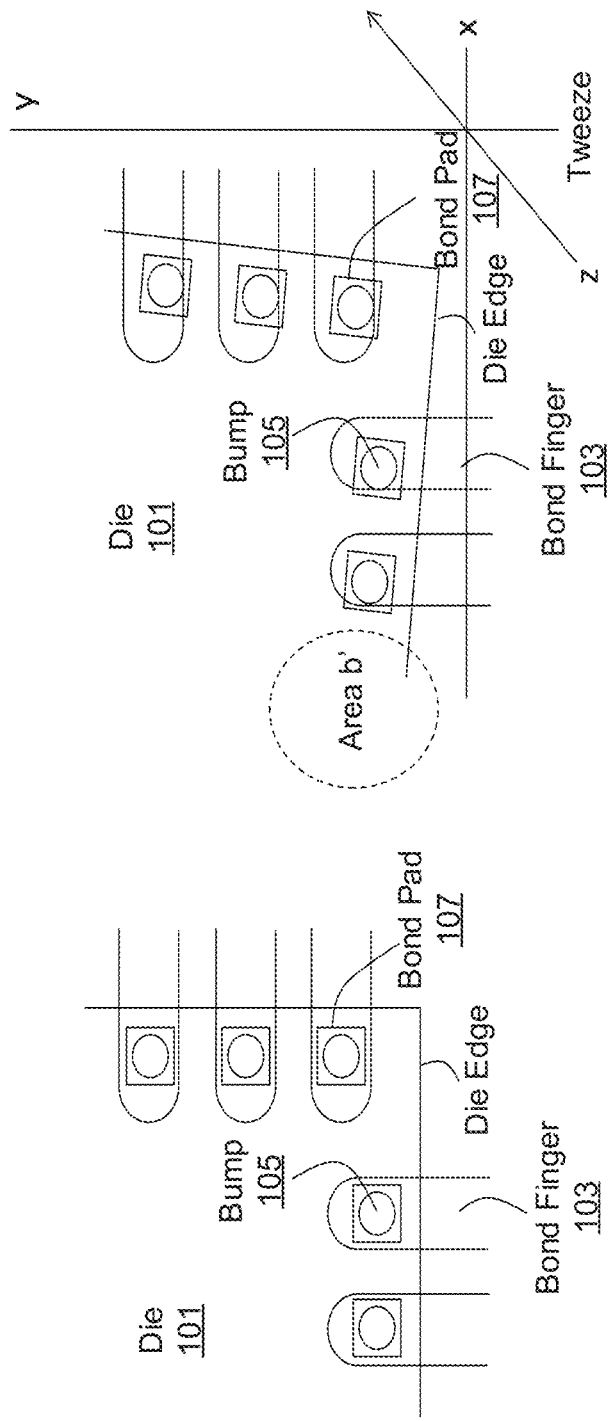
FIGS. 1A and 1B are schematics illustrating die-to-leadframe bonding alignment, in accordance with an example embodiment of the disclosure.

FIGS. 1A and 1B are schematics illustrating die-to-leadframe bonding alignment, in accordance with an example embodiment of the disclosure. Referring to FIG. 1, there is shown a die 101 flip-chip bonded to a plurality of leadframe bond fingers 103. There are also shown die bumps 105 and bond pads 107.

The die 101 may comprise an integrated circuit die that has been separated from a semiconductor wafer and may comprise electrical circuitry such as digital signal processors (DSPs), network processors, power management units, audio processors, RF circuitry, wireless baseband system-on-chip (SoC) processors, sensors, and application specific integrated circuits, for example.

The leadframe bond fingers 103 may comprise metal fingers originally extending from a support section of a leadframe prior to being singulated into the final package. The bond fingers 103, also known as leads, may provide mechanical support for and electrical contact to the die 101. The die bumps 105 on the die 101 may provide for electrical contact to the die 101 through the bond pads 107, which may comprise metal pads formed on the surface of the die 101. The bond pads 107 may be defined by holes formed in a passivation layer and/or a polyimide layer on the die 101, thereby providing electrical isolation between the bond pads 107 where solder could cause shorting.

The die bumps may comprise one or more solder metals that melt at a lower temperature than the other metals, such that upon melting and subsequent cooling, the die bumps 105 provide mechanical and electrical bonding between the bond fingers 103 and the bond pads 107.

When flip chip die are integrated into a leadframe substrate type package, one of the challenges faced is alignment of the bumps to the narrow lead features of the leadframe during die placement and then maintaining the alignment through the process used to form the bond between the die bumps and the leadframe—such as a mass reflow process. Solder reflow processes may be applied to minimize alignment issues (e.g. —pre-tinning of the leadframe, applying solder paste to the frame prior to die attach, applying flux to both die bumps and frame, etc.), but in many cases these are not sufficient to prevent the die from shifting during handling or the reflow process, resulting in bump-off-frame alignment rejects or incomplete or weak solder joint formations. The effect of the die movement during reflow can, for example, be seen as tilt (movement in the x direction) or "tweeze" (movement in the z direction).

FIGS. 1A and 1B illustrate a die bonded to leadframe configuration. FIG. 1A depicts die-to-substrate alignment in ideal alignment conditions and FIG. 1B illustrates die misalignment that may occur during die placement or during the reflow process, such that the solder bumps misalign to the leads. For example, a solder bump-to-lead total misalignment resulting in a no-connect may occur. All solder joints resulting from the attachment illustrated in FIG. 1B may, for example, be considered "reject" joints.

In an example scenario, recessed self-alignment features (e.g., recesses or dimples) may be formed in the bond fingers 103 such that during a reflow process when the die bumps 105 at least partially melt, the dimples cause the die 101 to self-align since the preferred location of the bumps will be in the recesses of the bond fingers 103. The dimples may be formed in each of the bond fingers 103 or in a subset of the fingers, and may be formed by stamping or etching, for example. Although, leadframe fingers are shown in FIGS. 1A and 1B, the disclosure is not so limited. Other support structures may be utilized, such as a substrate with dimples formed thereon, to which the die bumps 105 become aligned upon reflow.

Figure 2:
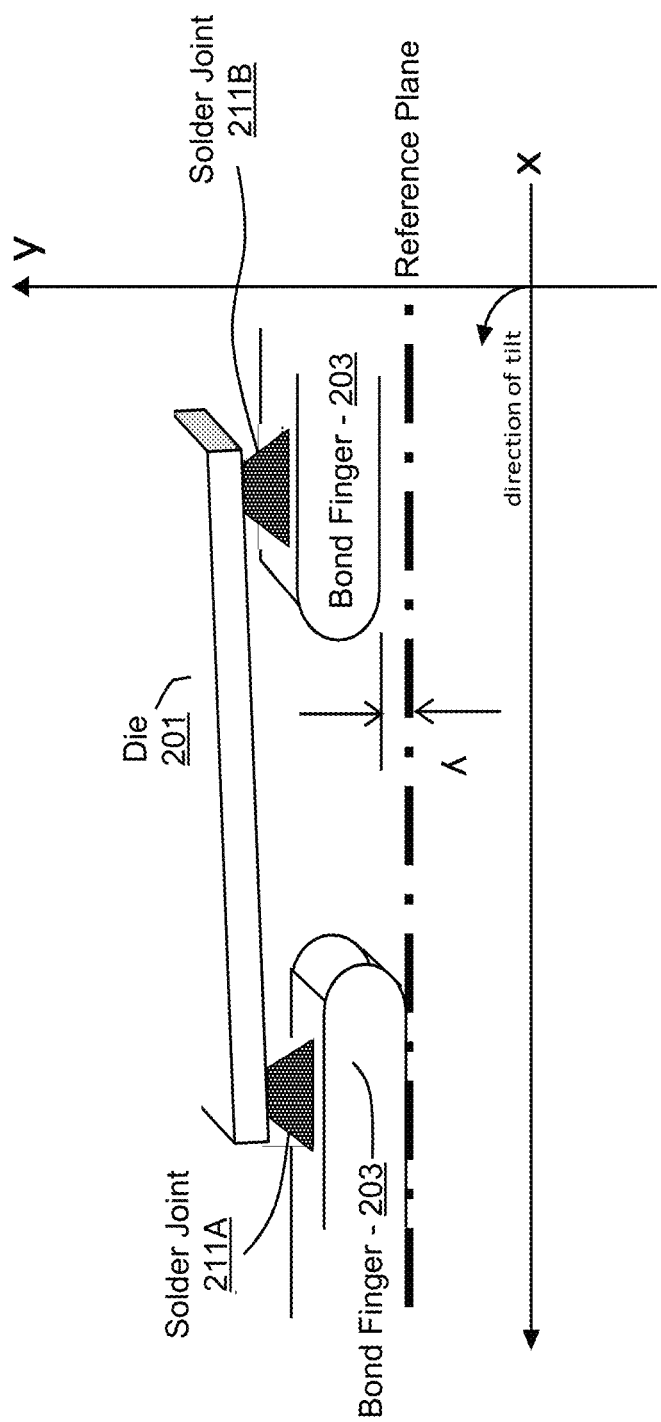
FIG. 2 illustrates another possible misalignment of solder joints for a bonded die, in accordance with an example embodiment of the disclosure.

FIG. 2 illustrates another possible misalignment of solder joints for a bonded die, in accordance with an example embodiment of the disclosure. Referring to FIG. 2, there is shown a die 201, bond fingers 203, and solder joints 211A and 211B. The die 201 and bond fingers 203 may be similar to the die and bond fingers described with respect to FIGS. 1A and 1B, and the solder joints 211A and 211B may comprise die to leadframe or substrate joints after a reflow process where the solder joint 211A comprises an extended solder joint and the solder joint 211B comprises a compressed solder joint. The differences between these joints may be caused by height differences of the bond fingers 203.

In the case of small die, small packages, and/or high density substrates, another effect, known as "tombstoning," where one side of the die is soldered and in the extreme may cause the die to stand on end, resulting in weakened or non-formed solderjoints. This defect may be difficult to detect as the defect lies in the same plane as the die and substrate. Inspection is much more of a challenge, especially in the case of high density substrates and where the die solder bump is located away from the periphery of the die edge.

FIG. 2 shows two of a plurality of solder joints in an exaggerated die tilt situation caused by the leadframe substrate flexing during solder reflow. The die begins a rotation similar to tombstoning seen with small peripheral components in surface mount technology processes. Though not always detectable at t=0 during electrical test or catastrophic in-stress testing, the solder joint integrity may be compromised by the flex of the leadframe and due to the solder volume being displaced from the point of contact on the substrate—the "ideal" interconnect and interface contact area. When considering a plurality of solder joints, especially with a small die, and the lead fingers flexing in a non-homogeneous fashion, the concern for solder joint integrity and strength is significantly increased.

A somewhat unique process issue noted with this type of interconnect (die bumps) on a leadframe substrate, is the flexing of the substrate that occurs during the reflow process in the die attach step. The tolerance in the amount of flex, X, in FIG. 2, may be derived from the leadframe material composition and the reflow profile. The lead fingers have a tendency to "flex" (x-y-z) when exposed to the high thermal environment associated with a reflow process as is consistent with a reflow oven. In wire bond applications, a reflow process is not a typical procedure and, if applied, is done so after the mold process, thus potentially eliminating the lead finger 'flexing' phenomena.

In an example scenario, dimples may be formed in the bond fingers 203 such that during a reflow process when the die bumps 105 at least partially melt, the dimples cause the die 101 to self-align since the preferred location of the bumps 105 will be in the recesses of the bond fingers 103, improving bond quality even if the leadframe or substrate are not perfectly planar. The dimples may be formed in each of the bond fingers 103 or in a subset of the fingers, and may be formed by stamping or etching, for example.

Figure 3:
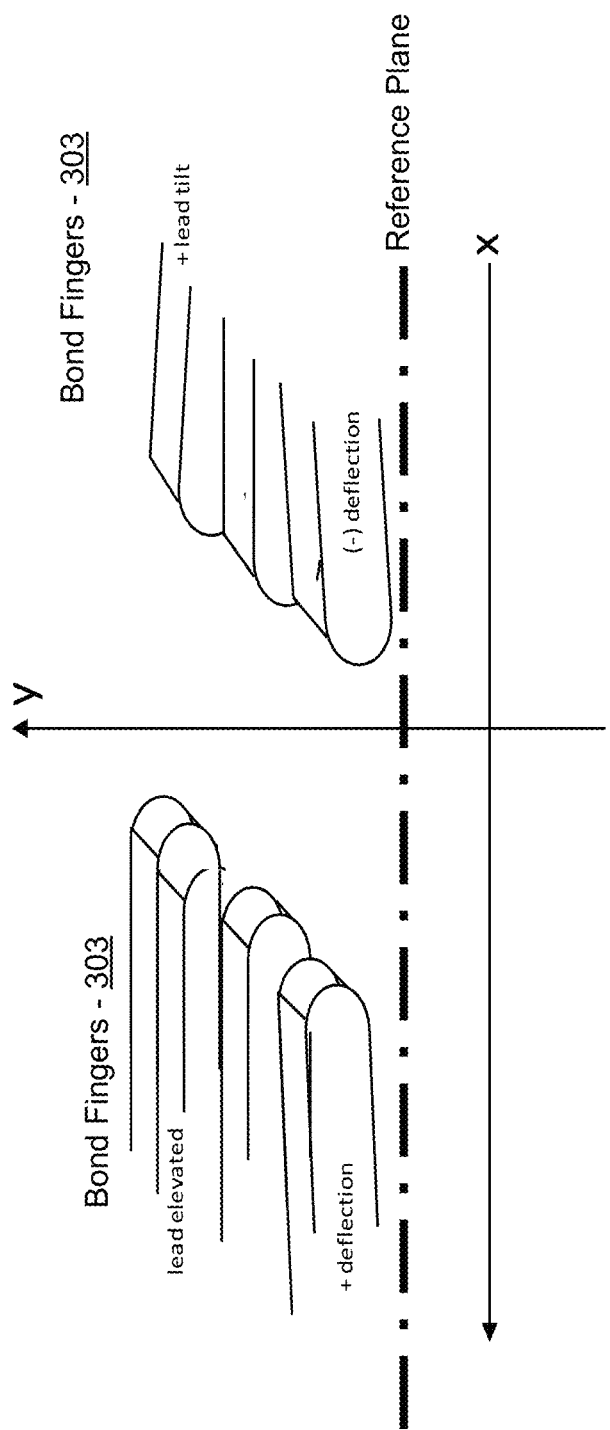
FIG. 3 illustrates leadframe bond finger deflection during a reflow process, in accordance with an example scenario of the disclosure.

FIG. 3 illustrates leadframe bond finger deflection during a reflow process, in accordance with an example scenario of the disclosure. Referring to FIG. 3, there is shown bond fingers 303. In a reflow process where a die is bonded to the bond fingers 303 of a leadframe, the ramp duration and/or reflow profile may be exceptionally long, and may vary based on the substrate and unit density. However, even though the duration can exacerbate the flexing phenomena, it may not be long enough to compensate for it, meaning that the frame does not reach a steady state temperature, and, hence, the interconnect process never reaches equilibrium. As a result, the integrity of the solder joints may be compromised by pre-induced metal fatigue. The effects of this "imbalance" in the solder joint strength may not be immediately detectable (at t=0), resulting in the possibility of latent, long term reliability failure.

FIG. 3 illustrates a plurality of substrate lead fingers with potential deflection and tilt aspects that are a result of the reflow process required to attach the die solder balls to the leadframe. The flexing of the lead fingers is dynamic and may result in stressing the solder joint and compromising the integrity of the interconnect leading to solder joint fatigue and latent device level functional and/or mechanical failure.

One way to improve bonding yield and reliability is to increase the surface area of the connection interface (e.g., solder bump-to-leadframe interface) by increasing the size of the die solder ball bump and the bond fingers. However, by doing so, this significantly limits the capabilities of flip chip die in leadframe packages. Increasing the lead finger dimensions in the x-y directions is not always practical or appropriate. Leadframe manufacturing capabilities may limit how much the dimensions can be modified as restricted by process tolerances and design limitations. Increasing the lead finger width further limits the pitch of the die solder bumps, or other interconnect structures, thus further restricting the use of flip chip die in leadframe designs.

However, in an example embodiment of the disclosure, by incorporating dimples, or locking features, in the leadframe, the contact surface area may be increased without increasing the solder bump pitch, the size of solder bumps themselves, or the bond finger pitch, as illustrated further in FIGS.

Figures 4A, 4B:
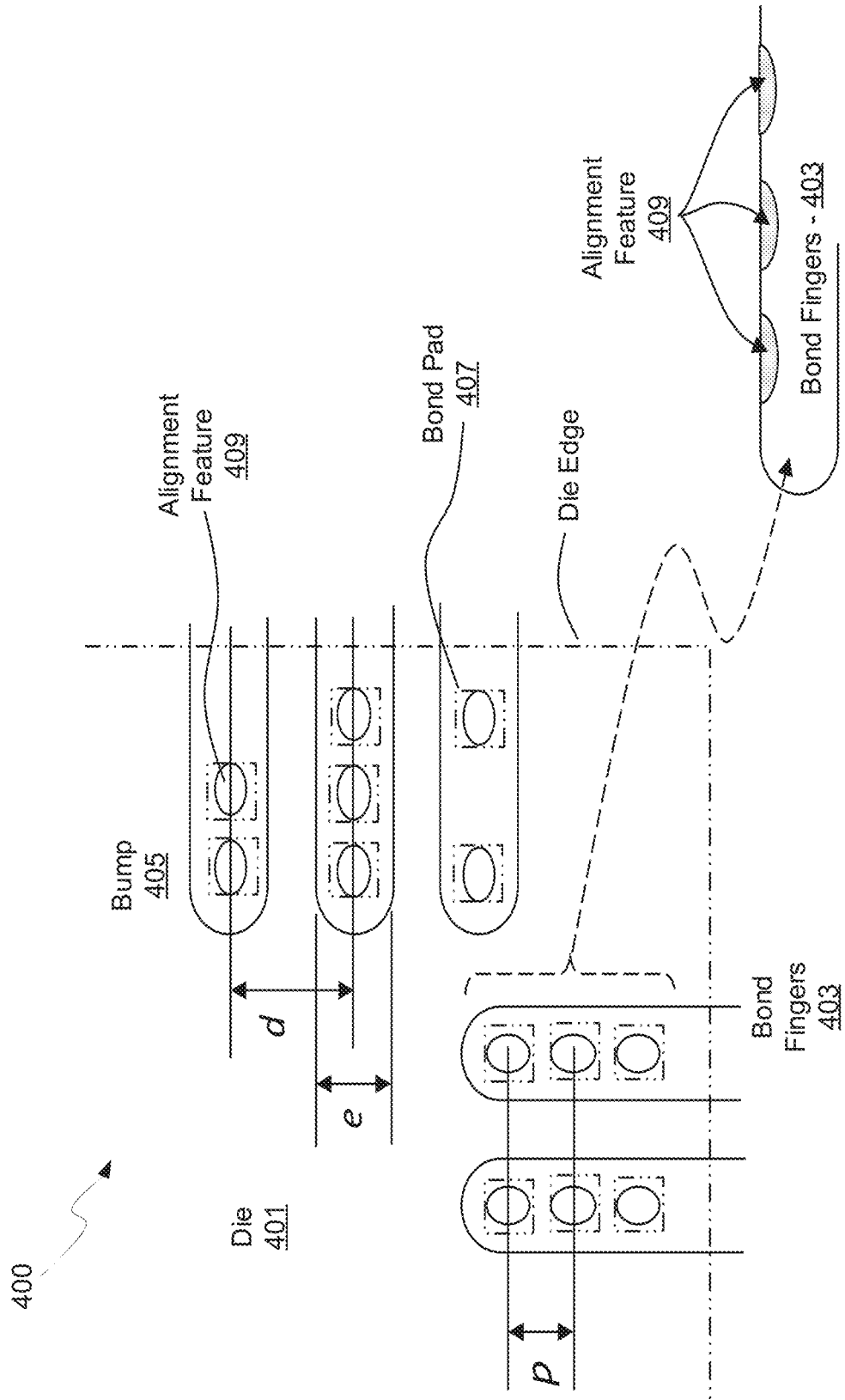
FIGS. 4A-4D illustrate self-alignment features formed in leadframe bond fingers, in accordance with an example embodiment of the disclosure.

4A-4D. FIGS. 4A-4D illustrate self-alignment features formed in leadframe bond fingers, in accordance with an example embodiment of the disclosure. Referring to FIG. 4A, there is shown a leadframe 400 with self-alignment features 409 on bond fingers 403. There is also shown a die 401 comprising die bumps 405 and bond pads 407. The die 401, die bumps 405, and bond pads 407 may be as described previously, for example, and the bond fingers 403 may illustrate self-alignment features 409 formed in the fingers 403. The pitch of the bond fingers is labeled "d," the finger width as "e," and the alignment feature pitch are labeled "p."

As shown in FIG. 4B, the self-alignment features 409 may comprise dimples, or recessed areas, in the bond fingers 403. Incorporating the self-alignment features 409 in the bond fingers 403 does not introduce design or process limitations as described above for increased solder ball and bond finger size. The self-alignment features, or locking dimples, do not require modifying the size of the die solder bumps and are not limited by a die bump technology. Therefore, leadframe processing capabilities may be applied to increase the effective use of flip chip die in leadframe packaging solutions—and also may enhance flip-chip-in-laminate-substrate solutions as well.

The recessed self-alignment features 409 shown in FIGS. 4A-4D may be formed in pairs or triplets, or other numbers, depending on the overlap of the die with the bond fingers 403 and may be formed in bond fingers that correspond with the corners of the die 401, for example, as shown in FIG. 4A. However, the disclosure is not so limited, as any combination of self-alignment features may be formed in the bond fingers 403.

The bump pitch, p, shown in FIG. 4A may vary depending upon the design, die bump pitch, and die bump technology utilized. The leadframe pitch (d) and the bond finger width (e) may also vary depending upon the leadframe and die design, the leadframe manufacturing processes utilized, and the leadframe material utilized. The self-alignment features 409 may enable increasing the surface area for the bump attach interface without changing design rules or requiring the modification of the bond finger width and pitch, or compromising the x-y dimensional tolerances of the bond fingers 403. Furthermore, the self-alignment features 409 enable self-alignment that eliminates the "tweezing" effect as depicted in FIG. 1 and minimizes any reduction of solder joint integrity due to the bond finger flexing and "tombstone" effects depicted in FIGS. 2 and 3.

By the addition of a recessed area, consistent with the bump placement of the die 401, the die 401 will tend to "self-align" during die placement and then hold alignment during reflow, resulting in the elimination and/or substantial reduction of the tweezing effect and/or other types of misalignment previously described. In addition, by increasing the effective surface area for the solder ball joint, the effects of leadframe flexing may be reduced.

It may be desirable to screen print solder paste onto the leadframe to further minimize the effects of flexing, but is not required. Further, the recess areas may not be required to be fabricated on all bond fingers. For example, eight, four, or even two, of the corner leads may be sufficient to obtain the desired results of eliminating and/or substantially reducing the effects of thermal "tweezing."

Figure 4D:
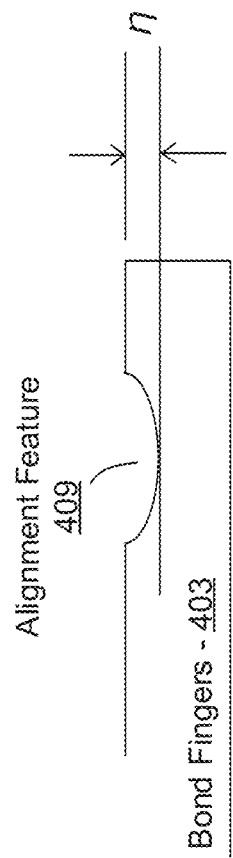
Figure 4C:
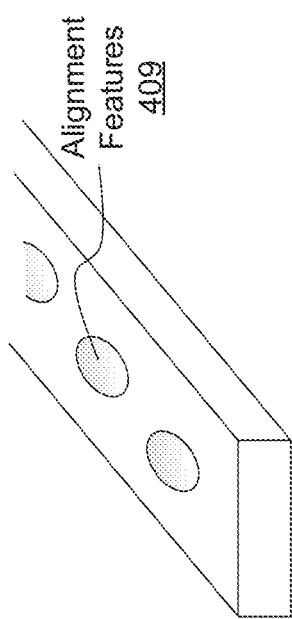

FIG. 4C depicts a 3D perspective of the recess areas, or self-alignment features 409, and FIG. 4D depicts the importance of the depth, $\eta$, of the alignment feature, which may be based on the bump height and diameter, the bump material, the die size, and the number of bumps being aligned.

As depicted, the self-alignment features 409 may vary in size and number, depending upon the die bump layout and the leadframe technology utilized. In an example scenario, the depth, $\eta$, of the alignment recess may be less than 50 µm, although this maximum may vary depending upon the bump size, bump technology applied, and etching process applied during the leadframe manufacturing process.

However, unless the bump recess feature is pre-filed with solder paste, the recess may typically be less than 70 µm, as deeper might not provide sufficient stand-off between the die and the leadframe after reflow and bump collapse for underfill, and may actually increase the stress applied to the solder ball interface joint.

It should be noted that although the self-alignment features 409 may be formed using a mechanical stamping process, an etch process may be preferred as it may be the most cost-effective method. Furthermore, the shape of the recess may also vary, since it is not necessary to match the more spherical shape of the die bump. For example, a more elliptical shape may actually result in a better alignment feature.

The shape of the self-alignment features 409 may also be a function of the leadframe manufacturing process and the final leadframe dimensions and design, although the shape is not necessarily critical and may comprise any shape that may be defined by the leadframe manufacturing process. One example consideration is that the recess be consistent with the die bump configuration and provide additional surface area to enable the self-alignment benefit.

In an example scenario, the self-alignment features 409 may be formed during the leadframe manufacturing process, such that no additional processes are required during the package assembly processes unless, for example, it is desirable to apply solder paste to the leadframe prior to die attach and/or perform other preparatory operations. Thus, improved bonds may be obtained by modification of existing leadframe designs, enabling a leadframe to be utilized for both wirebond processing as well as flip chip.

Figure 5:
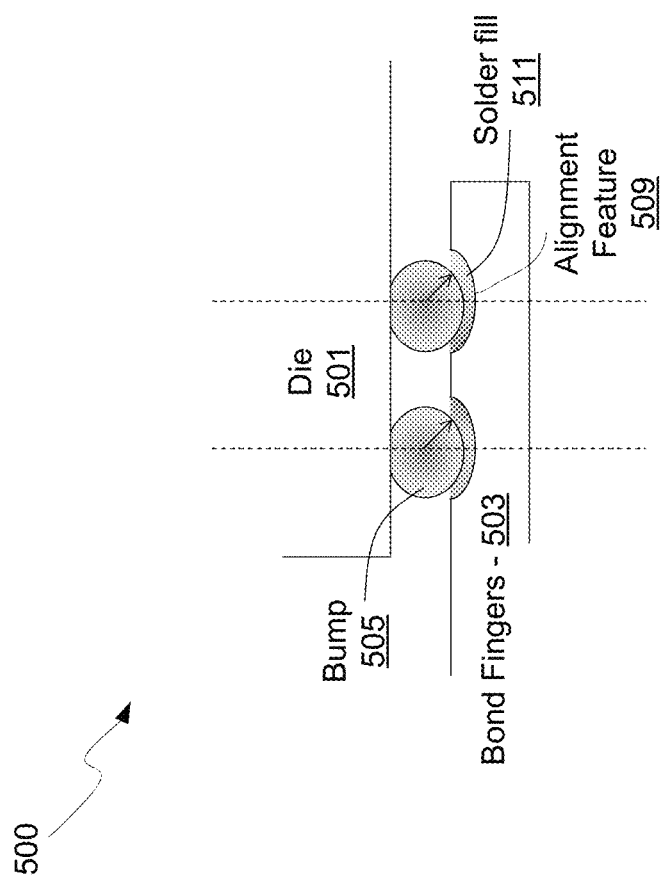
FIG. 5 illustrates a die-to-leadframe bonding utilizing self-alignment features, in accordance with an example embodiment of the disclosure.

FIG. 5 illustrates a die-to-leadframe bonding utilizing self-alignment features, in accordance with an example embodiment of the disclosure. Referring to FIG. 5, there is shown a cross-sectional view of a self-aligned bond 500 comprising a die 501 with bumps 505 and bond fingers 503 with self-alignment features 509. In addition the self-alignment features 509 (e.g., dimples) comprise solder fill 511, which may assist in the self-alignment of the bumps 505.

When a leadframe comprising the bond fingers 503 is processed through a mass reflow process, the solder in the bump 505, or a bump solder cap in the case of a Cu pillar bump, softens and begins to reflow. The die is depicted as being slightly misaligned relative to the recesses. The arrows within the bumps 505 in FIG. 5 depict how the alignment will occur during the reflow process. In the pre-molten state, the surface tension of the solder will pull the die bump, and thus the die, into alignment with the bump alignment recess features 509 on the leadframe finger 503. Thus, a self-aligning of the die 501 to the leadframe occurs.

As the solder (Pb—Sn, Pb-free, Cu pillar with solder cap, or other suitable material) goes through the transitional phases of melt fusion, the die and congruent bumps will seek physical alignment—the "pull" effect. Pre-tinning or a solder print process on the substrate to at least partially fill the solder bump alignment features with solder fill 511 may provide additional benefit for solder joint strength and integrity as well as reduce the attach process time by optimizing the ramp profile for the reflow process. In instances where the substrate or bond finger 503 surface is composed of a material that is clean and appropriate for the die solder bump composition, the solder fill process step may be eliminated.

It should be noted that self-alignment features are not limited to leadframe devices. The same concept of a locking or recessed alignment features may be applied to laminate substrates or other appropriate materials as well. The bump pitch, die bump composition, configuration, and location may vary by design or material set. As such, the design and configuration of the alignment features may vary in an appropriate fashion.

Figure 6:
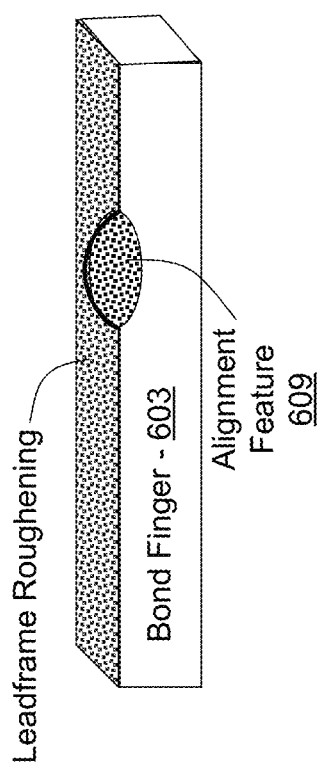
FIG. 6 illustrates a bond finger with a roughened surface, in accordance with an example embodiment of the disclosure.

FIG. 6 illustrates a bond finger with a roughened surface, in accordance with an example embodiment of the disclosure. Referring to FIG. 6, there is shown a bond finger 603 with a self-alignment feature 609, which may, for example, be the same or similar to the bond fingers and self-alignment features described previously but with a roughened surface. The surface of the bond finger 603 and the self-alignment feature 609 may be roughened utilizing a chemical etch or a physical process, such as a sand-blasting or mechanical embossing type of technique.

Figure 7:
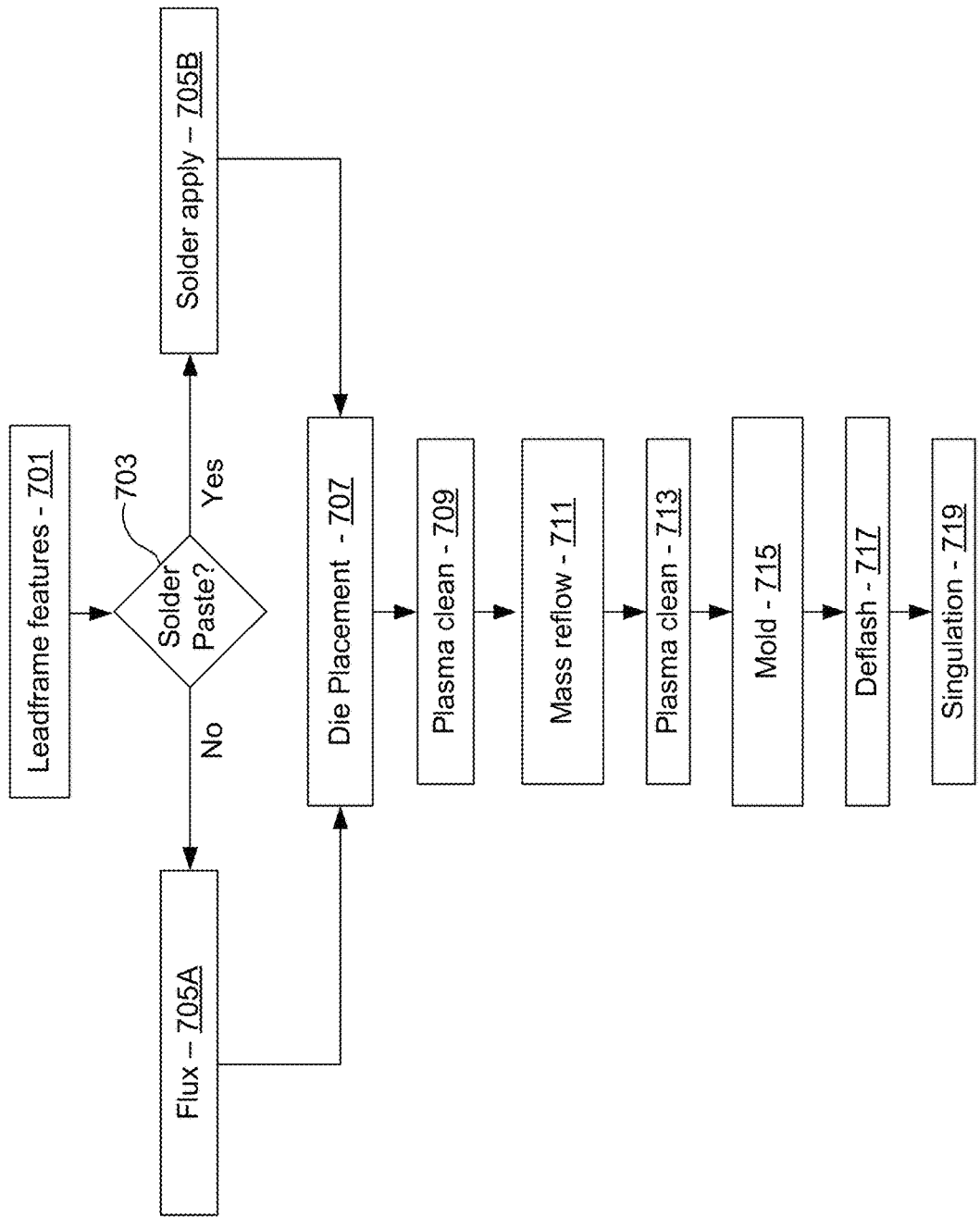
FIG. 7 is a flow chart illustrating example steps for a self-aligned electrical connection, in accordance with an example embodiment of the disclosure.

FIG. 7 is a flow chart illustrating example steps for a self-aligned electrical connection, in accordance with an example embodiment of the disclosure. The process described in FIG. 7 may correspond to the process described with respect to FIGS. 1-6, for example. In the first step 701, self-alignment features, or recesses, may be formed in a leadframe. In another example scenario, self-alignment features may be formed in another structure to which a die is to be bonded, such as a substrate or laminate structure.

In step 703, if the formed self-alignment features are to be at least partially filled with solder paste, the example steps may proceed to step 705B where solder paste may be applied to the self-alignment features before proceeding to step 707. If no solder paste is to be utilized, the die may be placed in a flux in step 705A before proceeding to step 707 for die placement where a die with solder bumps for electrical and physical contact to bond fingers on the leadframe is placed on the leadframe. In another example scenario, an optional flux process may also be utilized in instances when solder paste is to be used.

After die placement, the structure may be subjected to a plasma clean process step 709 for removing oxides and/or contaminants on the structure, followed by mass reflow step 711, where the bonded die and leadframe, or substrate, may be heated to at least partially melt solder bumps on the die. As the solder (Pb—Sn, Pb-free, Cu pillar with solder cap, or other suitable material) goes through the transitional phases of melt fusion, the die and congruent bumps will seek physical alignment, pulling the die into an aligned position.

In plasma clean step 713, another cleaning process may be utilized to remove any contaminants following reflow followed by mold step 715, where an encapsulant material, such as an epoxy, for example, may cover the die, bonds, and at least a portion of the leadframe, thereby providing environmental and physical protection for the die and its bonds to the leadframe.

Following the mold step, a deflash step 717 may be utilized to remove any excess mold material extending outside the desired volume of the finished package, which may be formed in a singulation step 719 where the package is sawn or singulated into individual packages.

By implementing the recess bump self-alignment features described in FIGS. 1-7, the die bump attach process is therefore self-aligning, substantially reducing and/or eliminating the effects of tweeze, and/or other types of misalignment, and the potential for the described tombstoning effect.

In this way, manufacturing yields and device bump interconnect reliability are enhanced. The addition of the locking or recessed alignment features does not add a significant amount of cost to the substrate process and, if the solder fill or leadframe pre-tin process is not utilized, does not add any or at least any significant cost to the assembly process cost. In an etching process, the addition of the recessed alignment feature might require an additional photo mask process during substrate manufacturing. For a stamping process, modification to the stamping tool might be required but adds no additional processing steps or additional cost once the tool is manufactured.

In an embodiment of the disclosure, a method and system are disclosed for flip chip self-alignment features for substrate and leadframe applications. In this regard, aspects of the disclosure may comprise placing a semiconductor die on a plurality of bond fingers of a metal leadframe, wherein at least two of the plurality of bond fingers comprise one or more recessed self-alignment features. A reflow process may be performed on the semiconductor die and leadframe, thereby melting solder bumps on the semiconductor die such that a solder bump is pulled into each of the recessed self-alignment features and aligning the solder bumps on the semiconductor die to the plurality of bond fingers.

The recessed self-alignment features may be formed utilizing a chemical etch process or a stamping process. A surface of the recessed self-alignment features or at least one surface of the bond fingers of the metal leadframe may be roughened. A solder paste may be formed in the recessed self-alignment features prior to placing the semiconductor die on the plurality of bond fingers of the metal leadframe. The recessed self-alignment features may be elliptical-shaped.

A depth of the recessed self-alignment features may be less than 50 microns. Two recessed self-alignment features may be formed on at least one bond finger of the metal leadframe at locations corresponding with four corners of the semiconductor die. The die and at least one surface of the bond fingers may be covered with encapsulant.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method of manufacturing an electronic device, the method comprising:

placing a plurality of bumps of a semiconductor die on a top side of a plurality of bond fingers of a metal leadframe, wherein:
   each of the plurality of bumps comprises a metal pillar and a solder cap,
   each of at least two of the plurality of bond fingers comprises a curved sidewall recessed self-alignment feature, and
   each of the curved sidewall recessed self-alignment feature comprises a maximum width at a top end positioned toward the semiconductor die and a minimum width at a bottom end positioned away from the semiconductor die; and performing a mass reflow process, thereby melting the solder cap of each of the plurality of bumps, wherein:
at least one of the plurality of bumps is configured to be pulled into a respective one of the curved sidewall recessed self-alignment feature to align the plurality of bumps to the plurality of bond fingers, and
a continuous bond is formed between the at least one of the plurality of bumps and the respective one of the curved sidewall recessed self-alignment feature that entirely laterally surrounds a portion of the at least one of the bumps.

2. The method of claim 1, wherein a width of the bumps prior to said performing the mass reflow process is no greater than the maximum width of the curved sidewall recessed self-alignment feature.

3. The method of claim 1, comprising, prior to said performing the mass reflow process:
forming a solder paste in each of the curved sidewall recessed self-alignment feature, and
placing the bumps of the semiconductor die in contact with the formed solder paste.

4. The method of claim 1, wherein a first volume of a first portion of the at least one of the plurality of bumps within the respective one of the curved sidewall recessed self-alignment feature is less than a second volume of a second portion of the at least one of the plurality of bumps outside of the respective one of the curved sidewall recessed self-alignment feature.

5. The method of claim 1, wherein each of the curved sidewall recessed self-alignment feature is configured to compensate for height differences between the plurality of bond fingers.

6. The method of claim 1, comprising roughing a surface of at least one of the curved sidewall recessed self-alignment feature.

7. The method of claim 1, wherein, in the top-down view, each of the curved sidewall recessed self-alignment feature is elliptical-shaped.

8. The method of claim 1, wherein each of the at least two of the plurality of bond fingers comprises a plurality of the curved sidewall recessed self-alignment feature.

9. An electronic device comprising:
a metal leadframe comprising a plurality of bond fingers, wherein:
each of at least two of the plurality of bond fingers comprises a curved sidewall recessed self-alignment feature, and
each of the curved sidewall recessed self-alignment feature comprises a maximum width at a top end and a minimum width at a bottom end; and
a semiconductor die bonded to a top side of the metal leadframe and comprising a plurality of bumps, wherein:
each of the plurality of bumps comprises a metal pillar,
each of the plurality of bumps is soldered to a respective one of the curved sidewall recessed self-alignment feature thereby providing a continuous bond that entirely laterally surrounds a portion of each of the plurality of bumps, and
a first height of a first portion of each of the plurality of bumps within the respective one of the curved sidewall recessed self-alignment feature is less than a second height of a second portion of each of the plurality of bumps outside of the respective one of the curved sidewall recessed self-alignment feature.

10. The electronic device of claim 9, wherein said each of the plurality of bumps is mass-reflow soldered to the respective one of the curved sidewall recessed self-alignment feature.

11. The electronic device of claim 9, wherein the inner surface of at least one of the curved recessed self-alignment feature is roughened.

12. The electronic device of claim 9, wherein, in the top-down view, each of the curved sidewall recessed self-alignment feature is elliptical-shaped.

13. The electronic device of claim 9, wherein at least one of the plurality of bond fingers comprises a plurality of the curved sidewall recessed self-alignment feature.

14. An electronic device comprising:
a metal leadframe comprising a plurality of bond fingers, wherein:
each of at least two of the plurality of bond fingers comprises a curved sidewall recessed self-alignment feature with no flat surfaces, and
each of the curved sidewall recessed self-alignment feature is elliptical-shaped in a top-down view; and
a semiconductor die bonded to a top side of the metal leadframe and comprising a plurality of bumps, wherein:
each of the plurality of bumps comprises a metal pillar,
each of the plurality of bumps is soldered to a respective one of the curved sidewall recessed self-alignment feature thereby providing a continuous bond that entirely laterally surrounds a portion of each of the plurality of bumps, and
a first volume of a first portion of each of the plurality of bumps within the respective one of the curved sidewall recessed self-alignment feature is less than a second volume of a second portion of each of the plurality of bumps outside of the respective one of the curved sidewall recessed self-alignment feature.

15. The electronic device of claim 14, wherein said each of the plurality of bumps is mass-reflow soldered to the respective one of the curved sidewall recessed self-alignment feature.

16. The electronic device of claim 14, wherein each of the plurality of bumps comprises a maximum width that is no greater than a width of the respective one of the curved sidewall recessed self-alignment feature.

17. The electronic device of claim 14, wherein a surface of at least one of the curved recessed self-alignment feature is roughened.

18. The electronic device of claim 14, wherein at least one of the plurality of bond fingers comprises a plurality of the curved sidewall recessed self-alignment feature.

* * * * *